United States Patent
Wang (10) Patent No.: US 11,486,651 B2
(45) Date of Patent: Nov. 1, 2022

(54) VAPOR CHAMBER

(71) Applicant: Huang-Chieh Metal Composite Material Tech. Co., Ltd., New Taipei (TW)

(72) Inventor: Chin-Han Wang, New Taipei (TW)

(73) Assignee: HUANG-CHIEH METAL COMPOSITE MATERIAL TECH. CO., LT, New Taipei (TW)

( * ) Notice: Subject to any disclaimer, the term of this patent is extended or adjusted under 35 U.S.C. 154(b) by 149 days.

(21) Appl. No.: 16/997,934

(22) Filed: Aug. 20, 2020

(65) Prior Publication Data
US 2022/0057145 A1    Feb. 24, 2022

(51) Int. Cl.
*F28D 15/04*  (2006.01)
*H05K 7/20*   (2006.01)
*H01L 23/427* (2006.01)

(52) U.S. Cl.
CPC ........... *F28D 15/04* (2013.01); *H05K 7/2029* (2013.01); *H01L 23/427* (2013.01)

(58) Field of Classification Search
CPC ...... F28D 15/04; H05K 7/202; H05K 7/2029; H01L 23/427
See application file for complete search history.

(56) References Cited

U.S. PATENT DOCUMENTS

| | | | | |
|---|---|---|---|---|
| 5,006,417 A | * | 4/1991 | Jackson | C22C 32/0047 428/614 |
| 2003/0075306 A1 | * | 4/2003 | Zuo | F28D 15/046 165/104.26 |
| 2009/0040726 A1 | * | 2/2009 | Hoffman | F28D 15/0233 29/890.032 |
| 2016/0341486 A1 | * | 11/2016 | Kim | H01L 23/427 |

FOREIGN PATENT DOCUMENTS

| | | | | |
|---|---|---|---|---|
| CN | 202354019 U | 7/2012 | | |
| CN | 106373214 A | 2/2017 | | |
| JP | S60228851 A | * | 11/1985 | |
| KR | 2020027705 A | * | 3/2020 | ......... H05K 7/20309 |

OTHER PUBLICATIONS

Translation of Japanese Patent Document JPS60228851A entitled Translation—JPS60228851A (Year: 1985).*
Translation of Korean Patent Document KR1020200027705A entitled Translation—KR1020200027705A (Year: 2020).*

* cited by examiner

*Primary Examiner* — Paul Alvare
(74) *Attorney, Agent, or Firm* — Chun-Ming Shih; Lanway IPR Services (57) ABSTRACT

A vapor chamber composed of a lower shell, an upper shell and a working fluid is revealed. The upper and lower shells made of metal composite plates are connected closely to form a vacuum sealed cavity which the working fluid is filled in. The metal composite plate includes a metal matrix and a copper layer bonded to a surface of at least one side of the metal matrix. The metal matrix includes stainless steel and an aluminum silicon carbide (Al/SiC) metal matrix composite. The copper layer of the metal composite plate is treated by stamping process to form a support member inside the cavity. Thus complicated, polluting and high cost etching process is no more required. Therefore the production efficiency is improved and the cost is reduced. The metal matrix of the metal composite plate provides sufficient structural strength.

8 Claims, 10 Drawing Sheets

VAPOR CHAMBER

BACKGROUND OF THE INVENTION

Technical Field

The present invention relates to a heat transfer device, especially to a vapor chamber.

Description of Related Art

In 2002, the use of flat heat pipes as thermal spreaders in power electronics cooling has been investigated by Y. Avenas et al. A vapor chamber is used to spread heat from a heat source to a large area component for heat dissipation. By phase change and flows of working fluid inside a chamber of the vapor chamber, heat is transferred to a condensation end for being dispersed and the working fluid returns to the heat source by a wick structure to achieve rapid heat transfer and thermal diffusion.

Basically, the vapor chamber includes three parts-a wick structure, a container and a working fluid. Most of the vapor chambers available now have a housing made of copper sheet, aluminum sheet or stainless steel sheet. For example, an aluminum vapor chamber is revealed in Chinese Utility Pat. Pub. No. CN202354019U. Take a vapor chamber made of copper sheet as an example. In order to produce the vapor chamber, basically the copper sheet is processed into a preset size by stamping and then the microstructure on the upper cover and the lower cover is produced. The available techniques for producing the microstructure include machining (such as computer numerical control (CNC)), abrasive blasting, cold spray and spray welding. Next the upper cover and the lower cover are connected (such as by diffusion bonding) to form the container with a chamber therein. A water inlet is pre-formed on the container for following vacuuming and filling of the working fluid (usually pure water). The water inlet is closed and sealed after the working fluid being filled to a preset level to ensure the vacuum level in the chamber.

Owing to compact design and light weight of electronics, thin and light vapor chambers are required. The conventional vapor chamber which is formed by a housing (or an upper cover and a lower cover) made of copper sheets or aluminum sheets with a chamber therein is easily bent or deformed. The vapor chamber further includes proper supporting structure located on the inner side of the chamber and used for preventing the chamber from damage or collapse. Besides machining, the support structure can also be produced on the copper sheet or the aluminum sheet by other ways. Refer to the Chinese Invention Patent. Pub. No. CN106376214A, a thin vapor chamber is revealed and the support structure on the inner side of the chamber or other microstructure is produced by an etching process. However, the above abrasive blasting, cold spray, spray welding and etching process used for producing wick structure or support structure are quite complicated. Thus not only the manufacturing cost is increased, the processes are also easy to cause pollution.

SUMMARY OF THE INVENTION

Therefore it is a primary object to provide a vapor chamber which solves the problems mentioned above.

In order to achieve the above object, a vapor chamber according to the present invention includes: a lower shell, an upper shell, a support member, and a working fluid.

The lower shell is made of a metal composite plate and composed of a first surface and a second surface on two opposite sides respectively and a lower half tube extending from the edge of the lower shell. The metal composite plate includes a metal matrix and a copper layer bonded to a surface on one side of the metal matrix. The first surface has at least one flat surface for being in contact with a heat source while the lower half tube is provided with a first slot recessed from the second surface toward the first surface.

The upper shell is made of the metal composite plate and composed of a third surface and a fourth surface on two opposite sides respectively, and an upper half tube which is extending from the edge of the upper shell and corresponding to the lower half tube. The upper half tube includes a second slot recessed from the third surface toward the fourth surface. A periphery of the second surface of the lower shell and a periphery of the third surface of the upper shell are connected closely to form a hollow cavity between the lower shell and the upper shell. The edges at two sides of the lower half tube and the upper half tube are connected tightly and working together to form a metal tube communicating with the cavity. After evacuation of the cavity, the redundant tube is cut and a hole of the metal tube is sealed to form the vacuum sealed cavity.

The support member is mounted in the cavity and located between the second surface and the third surface for supporting the vacuum sealed cavity.

The working fluid is filled into the cavity which is vacuum and sealed.

Preferably, the thickness of the vapor chamber is in the range of 1.0 mm to 6.0 mm. The metal matrix of the metal composite plate includes stainless steel and an aluminum silicon carbide (Al/SiC) metal matrix composite. The thickness of the metal composite plate is 0.05 mm to 3.0 mm while the thickness of the copper layer is 5%~50% of the thickness of the metal composite plate.

Preferably, the metal matrix forms the first surface of the lower shell and the fourth surface of the upper shell while the second surface of the lower shell and the third surface of the upper shell are formed by the copper layer. The support member includes a plurality of protrusions which are produced by stamping process and arranged at the second surface, the third surface or both the second surface and the third surface. The protrusion is a truncated cone and an interval is formed between the bottoms of the two adjacent protrusions. The ratio of the maximum width of the truncated conical protrusion to the interval is 1:1 to 1:0.5.

Preferably, the metal matrix forms both the first surface of the lower shell and the fourth surface of the upper shell while the second surface of the lower shell and the third surface of the upper shell are made of the copper layer. The support member is a copper mesh which is attached to the surface on the inner side of the cavity.

Preferably, the first surface of the lower shell and the fourth surface of the upper shell are formed by the copper layers while the second surface of the lower shell and the third surface of the upper shell are made of the metal matrix. The support member is a copper mesh which is attached to the surface on the inner side of the cavity.

Preferably, the lower shell is a flat plate while the upper shell includes a second recess portion which is recessed from the third surface toward the fourth surface. The second recess portion and the lower shell together form the cavity. The peripheries of the second and third surfaces are wrapped around the second recess portion.

Preferably, the upper shell is a flat plate while the lower shell includes a first recess portion which is recessed from the second surface toward the first surface. The first recess portion and the upper shell together form the cavity. The peripheries of the second and third surfaces are wrapped around the first recess portion.

Preferably, the lower shell includes a first recess portion recessed from the second surface toward the first surface and the periphery of the second surface is wrapped around the first recess portion. The upper shell includes a second recess portion recessed from the third surface toward the fourth surface and the periphery of the third surface is wrapped around the second recess portion. The first recess portion and the second recess portion together form the cavity.

A vapor chamber according to the present invention includes: a lower shell, an upper shell, a support member, and a working fluid.

The lower shell is made of three-layer metal composite plate which includes a metal matrix and two copper metal layers bonded to surfaces on two opposite sides of the metal matrix respectively. The metal matrix is disposed between the first copper layer and the second copper layer. The lower shell includes a first surface and a second surface located on two opposite sides thereof respectively. The first copper layer is used to form the first surface while the second copper layer forms the second surface. The first surface has at least one flat surface used to contact a heat source while a lower half tube is extending from the edge of the lower shell and provided with a first slot recessed from the second surface toward the first surface.

The upper shell is made of three-layer metal composite plate. The upper shell has a third surface and a fourth surface located on two opposite sides thereof respectively. The first copper layer forms the third surface while the second copper layer is used to form the fourth surface. An upper half tube is extending from the edge of the upper shell and corresponding to the lower half tube. The upper half tube includes a second slot recessed from the third surface toward the fourth surface. A periphery of the second surface of the lower shell and a periphery of the third surface of the upper shell are connected firmly to form a hollow cavity between the lower shell and the upper shell. The edges at two sides of the lower half tube and the upper half tube are connected tightly and working together to form a metal tube communicating with the cavity. After evacuation of the cavity, the redundant tube is cut and a hole of the metal tube is sealed to form the vacuum sealed cavity.

The support member is mounted in the cavity and located between the second surface and the third surface for supporting the vacuum sealed cavity.

The working fluid is filled into the vacuum sealed cavity.

Preferably, the thickness of the vapor chamber is in the range of 1.0 mm to 6.0 mm. The metal matrix of the three-layer metal composite plate includes stainless steel and an aluminum silicon carbide (Al/SiC) metal matrix composite. The thickness of the three-layer metal composite plate is 0.05 mm to 3.0 mm. The first copper layer and the second copper layer have the same thickness while the total thickness of the first and the second cooper layers is 5%~50% of the thickness of the three-layer metal composite plate.

Preferably, the support member is a copper mesh which is attached to the surface on the inner side of the cavity.

Preferably, a distal end of the protrusion formed on the second surface is abutting against the third surface and a cap is arranged at the distal end of the protrusion.

Preferably, a distal end of the protrusion formed on the third surface is abutting against the second surface and a cap is arranged at the distal end of the protrusion.

Preferably, the distal end of the respective protrusions formed on the second surface and the distal end of the respective protrusions formed on the third surface are abutting against each other.

The present vapor chamber features on the metal composite plate used to produce the vapor chamber with the cavity. The support member is formed on the copper layer of the metal composite plate by stamping process, instead of completed, polluting and high-cost etching process. The metal matrix of the metal composite plate provides sufficient structural strength.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 3-1 is a schematic drawing showing an embodiment with a lower shell, an upper shell and a support member according to the present invention while the lower shell and the upper shell are separated from each other;

FIG. 3-2 shows a section of the embodiment in FIG. 3-1 (taken along the line A-A in FIG. 2) and a partial enlarged view thereof while a lower shell and an upper shell are closed connected according to the present invention;

FIG. 5-1 is a schematic drawing showing a further embodiment with a lower shell, an upper shell and a support member according to the present invention while the lower shell and the upper shell are separated from each other;

FIG. 5-2 shows a section and a partial enlarged view thereof of the embodiment shown in FIG. 5-1 in which the lower shell and the upper shell are closed connected according to the present invention;

FIG. 6-1 is a schematic drawing showing a fourth embodiment with a lower shell, an upper shell and a support member according to the present invention while the lower shell and the upper shell are separated from each other;

FIG. 6-2 shows a section and a partial enlarged view thereof of the embodiment shown in FIG. 6-1 in which the lower shell and the upper shell are closed connected according to the present invention;

DETAILED DESCRIPTION OF THE PREFERRED EMBODIMENT

The relative positions described in the following embodiment by the terms "upper", "lower", "left", "right", etc.

unless otherwise specified, are based on the directions shown by the components in the figures.

Figure 1:
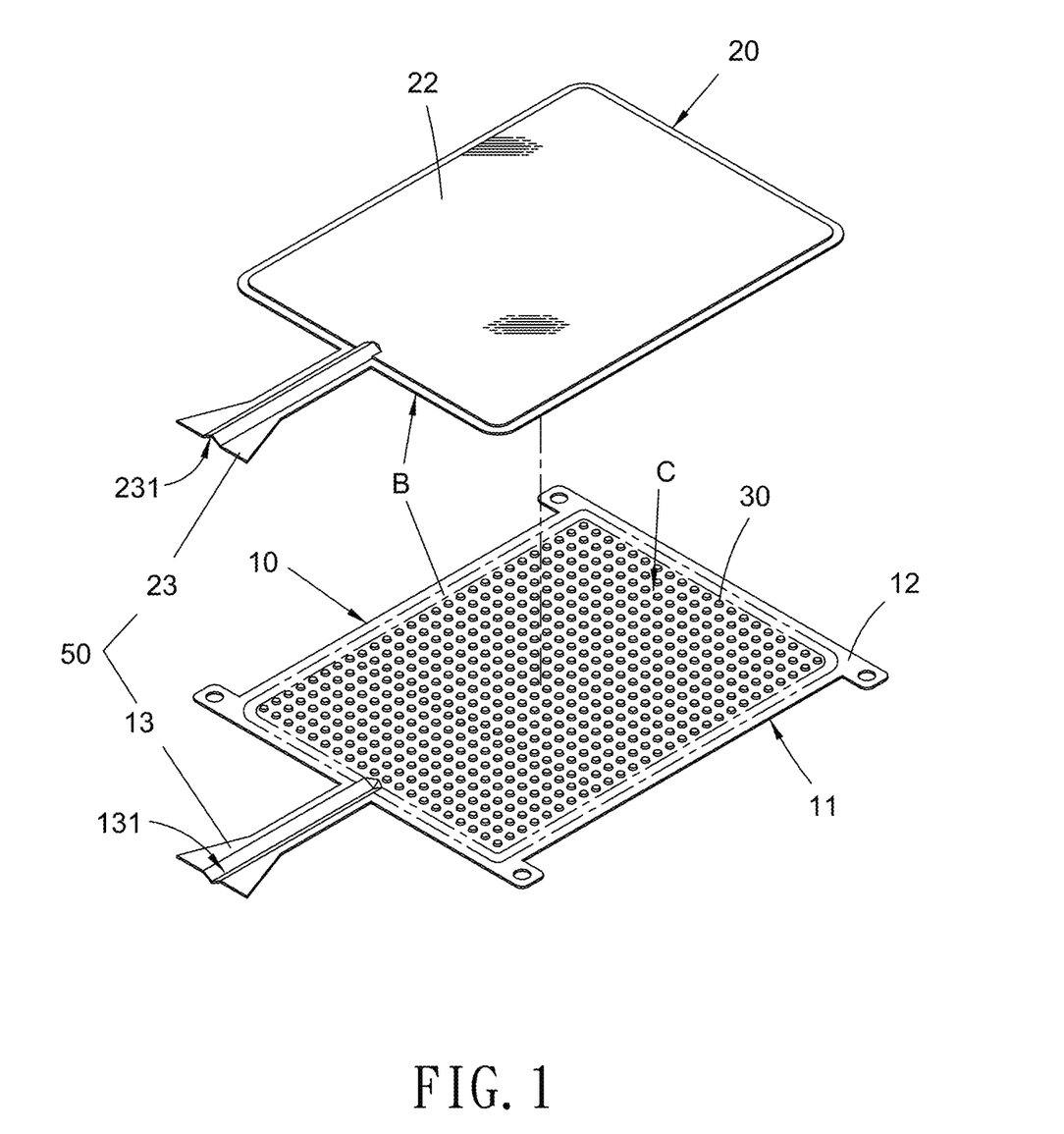
FIG. 1 is an explosive view of an embodiment of a vapor chamber according to the present invention.
Figure 7:
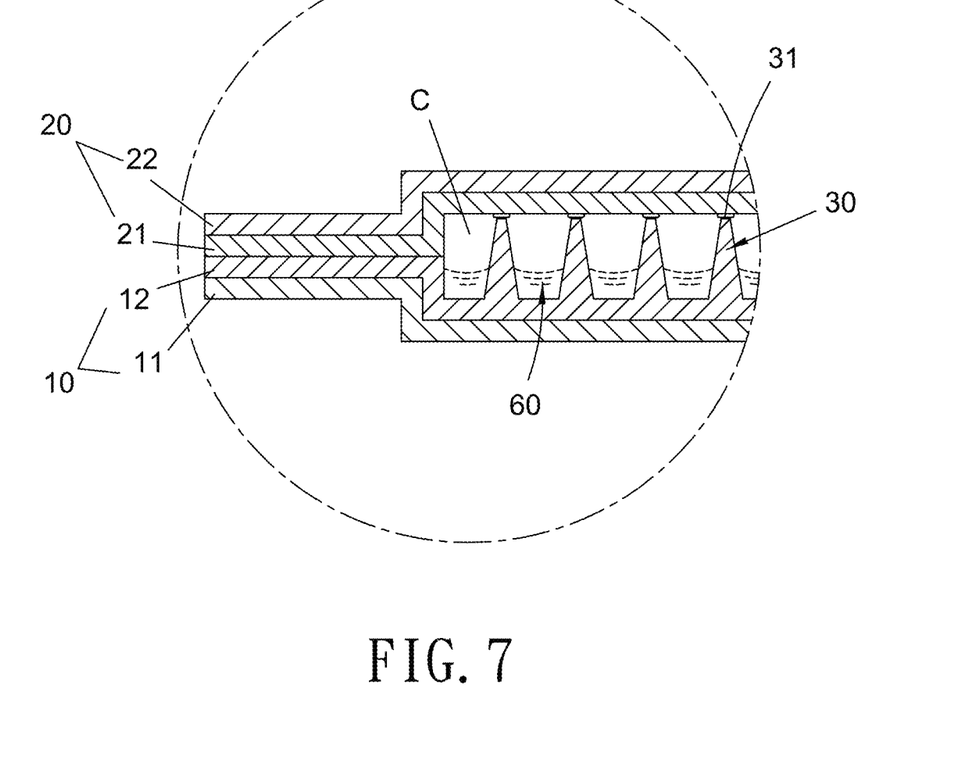
FIG. 7 is a partial enlarged view of a section of a further embodiment in which a support member has been modified according to the present invention.

In a preferred embodiment, a vapor chamber according to the present invention basically includes a lower shell 10, an upper shell 20 (as shown in FIG. 1), a support member, and a working fluid 60 (as shown in FIG. 7). In the following embodiments, the overall thickness of the vapor chamber is 1.0 millimeter (mm) to 6.0 mm.

Figure 2:
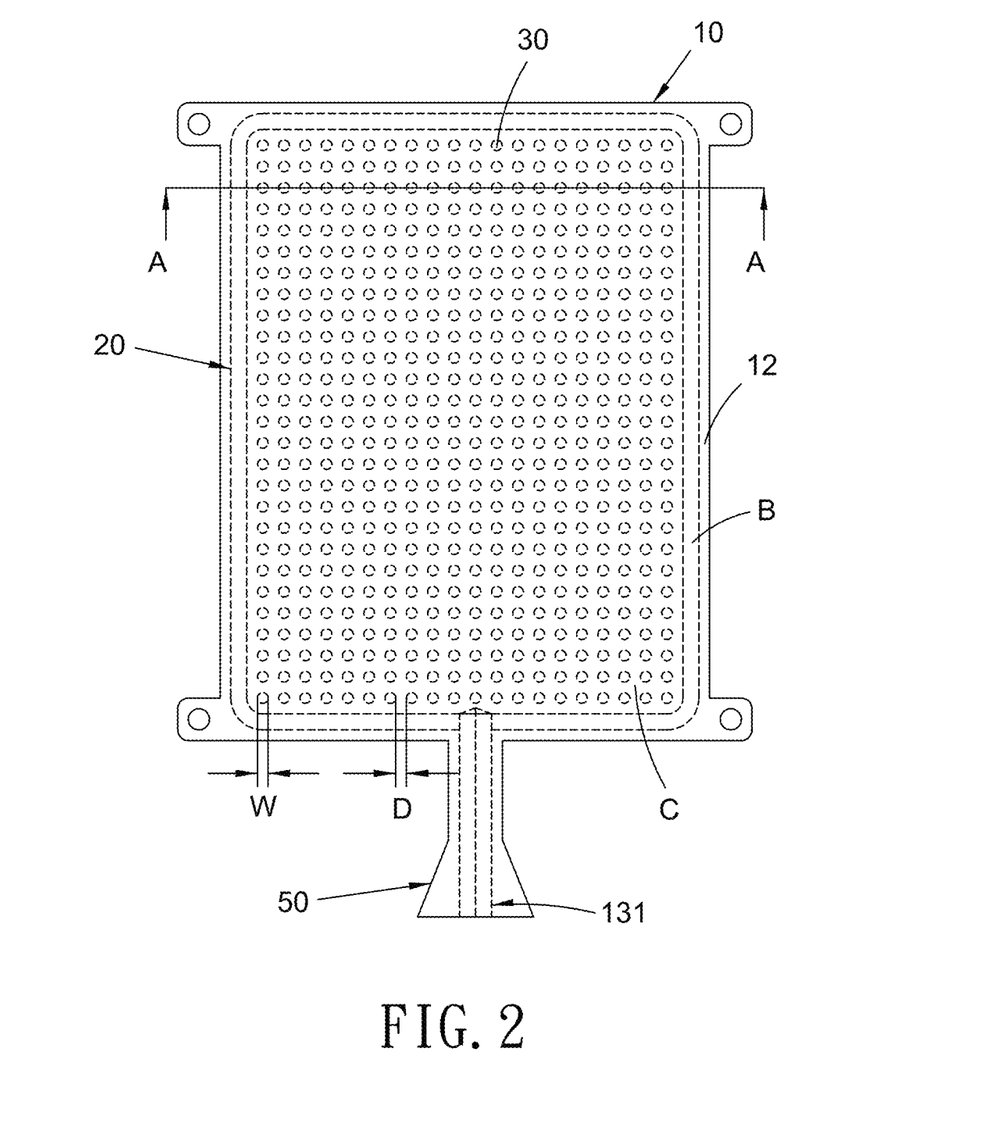
FIG. 2 is a schematic drawing showing a front side of a lower shell of the embodiment in FIG. 1 according to the present invention.

Refer to FIG. 1, an explosive view of an embodiment of a vapor chamber according to the present invention is revealed. Also refer to FIG. 2, a perspective view of a front side of the embodiment in FIG. 1 is disclosed and the upper shell 20 is shown by dashed lines owing to its location on a rear side of the lower shell 10. Both the lower shell 10 and the upper shell 20 are formed by metal composite plates each of which includes a metal matrix and a copper layer composited together while the copper layer is bonded to a surface on one side of the metal matrix.

The metal matrix includes stainless steel and an aluminum silicon carbide (Al/SiC) metal matrix composite (MMC). In order to produce Al/SiC MMC, a metal matrix, aluminum, and a ceramic reinforcement (SiC, silicon carbide) are treated by sintering in powder metallurgy process, pressed into sheet material and then processed by rolling process together with a copper layer to get the metal composite plate. Generally, the ratio of aluminum to silicon carbide in Al/SiC MMC is 1:1. That means Al/SiC MMC contains 50% of aluminum and 50% of silicon carbide. Sic particles are dispersed in an aluminum alloy homogeneously so as to have better physical properties such as light weight and high stiffness (the same density as aluminum and the stiffness is 1.6 times higher), low coefficient of thermal expansion (smaller than copper), and high thermal conductivity (1.4 times higher than common cast materials). In a preferred embodiment, the thickness of the vapor chamber is 1.0 mm to 6.0 mm. The metal matrix of the metal composite plate with double-layer structure includes stainless steel and one of the Al/SiC metal matrix composites. The thickness of the metal composite plate is 0.05 mm to 3.0 mm while the thickness of the copper layer in the metal composite plate is 5%~50% of the thickness of the metal composite plate. Preferably, the ratio of the thickness of the metal matrix to the thickness of the copper layer is 1:1 so that the vapor chamber has better structural strength. Compared with a conventional vapor chamber made of copper or aluminum completely, the vapor chamber made of the double-layer metal composite plate will not be bent or deformed easily when an external force is applied to it.

Refer to FIG. 1, the lower shell 10 consists of a first surface 11, a second surface 12 and a lower half tube 13. The first surface 11 and the second surface 12 are located on two opposite sides respectively. The first surface 11 includes at least one flat surface for being in contact with a heat source while the lower half tube 13 is extending from the edge of the lower shell 10 and provided with a first slot 131 recessed from the second surface 12 toward the first surface 11. The upper shell 20 consists of a third surface 21, a fourth surface 22 and an upper portion 23. The third surface 21 and the fourth surface 22 are located on two opposite sides respectively. The upper half tube 23 is extending from the edge of the upper shell 20 and corresponding to the lower half tube 13. The upper half tube 23 includes a second slot 231 recessed from the third surface 21 toward the fourth surface 22. A periphery B of the second surface 12 of the lower shell 10 and a periphery B of the third surface 21 of the upper shell 20 are connected closely (such as by diffusion bonding or laser bonding) so that a hollow cavity C is formed between the lower shell 10 and the upper shell 20. The lower half tube 13 and the upper half tube 23 are produced by stamping while edges at two sides of the lower half tube 13 and the upper half tube 23 are connected tightly and working together to form a metal tube 50 communicating with the cavity C. A hole at one end of the metal tube 50 is used as an inlet for creating a vacuum or filling the working fluid 60 in the cavity C. First the cavity C is pumped to a vacuum level and then the working fluid 60 (preferably pure water) is filled into the cavity C to a preset volume. After completing the filling, the redundant tube 50 is cut and the hole at one end of the metal tube 50 is sealed by a welding process to maintain the vacuum in the cavity C. The production of the vapor chamber is completed with the working fluid 60 filled inside the cavity C (as shown in FIG. 7).

When the vapor chamber is disposed on a heat source (such as a microprocessor of an electronic device), heat is transferred/conducted to the cavity C through the lower shell 10 so that the working fluid 60 inside which absorbs the heat turns into vapor full of the cavity C. While in contact with a condenser end of the vapor chamber having lower temperature, the heat absorbed by the vapor is released and the vapor is returned to the liquid phase. The working fluid in liquid phase is transported back to the heat source by the wick structure. By vapor-liquid cycles/phase change of the working fluid 60 in the cavity C, uniform heat transfer and dissipation is achieved.

In embodiments of a vapor chamber which includes the lower and the upper shells 10, 20 made of double-layer metal composite plate, the support member may have different shapes and structures. Refer to FIG. 2 and FIG. 3-1 to FIG. 7, the metal matrix of the double-layer metal composite plate forms the first surface 11 of the lower shell 10 and the fourth surface 22 of the upper shell 20 while the copper layer forms the second surface 12 of the lower shell 10 and the third surface 21 of the upper shell 20. The support member is mounted in the cavity C and located between the second surface 12 and the third surface 21 for supporting the vacuum and sealed cavity C. An embodiment of the support member includes a plurality of protrusions 30 produced by stamping process. The protrusions 30 can be formed on the second surface 12, the third surface 21 or both the second surface 12 and the third surface 21, spaced apart and distributed evenly within the cavity C. There is an interval D between the bottoms of the two adjacent protrusions 30 while the bottom of the protrusion 30 is defined as a connection between the protrusion 30 and the second surface 12 of the lower shell 10 or a connection between the protrusion 30 and the third surface 21 of the upper shell 20.

One of the functions of the protrusion 30 is to prevent the lower shell 10 and upper shell 20 of the cavity C from damage or collapse during evacuation of the cavity C. Another function of the protrusion 30 is used as the wick structure of the vapor chamber. With a proper interval D, the liquid-state working fluid 60 can attach to the bottom of the protrusion 30. Thereby the working fluid 60 further attaches to the surface on the inner side of the cavity C as much as possible. Thus the working fluid 60 absorbs the heat and transforms from liquid phase to vapor phase so as to achieve heat transfer and heat dissipation effects. Preferably, the protrusion 30 is a truncated cone. The width W of the bottom of the protrusion 30 is larger than the width of the distal end (which is defined as the end far away from the second surface 12 or the third surface 21) of the protrusion 30. The ratio of the maximum width W of the truncated conical protrusion 30 to the interval D is 1:1 to 1:0.5. Thereby the volume of the cavity C can be increased so as to increase the volume of the working fluid 60 in the cavity C of the vapor chamber and minimize the possibility of a dry-out of the working fluid 60.

Figure 31:
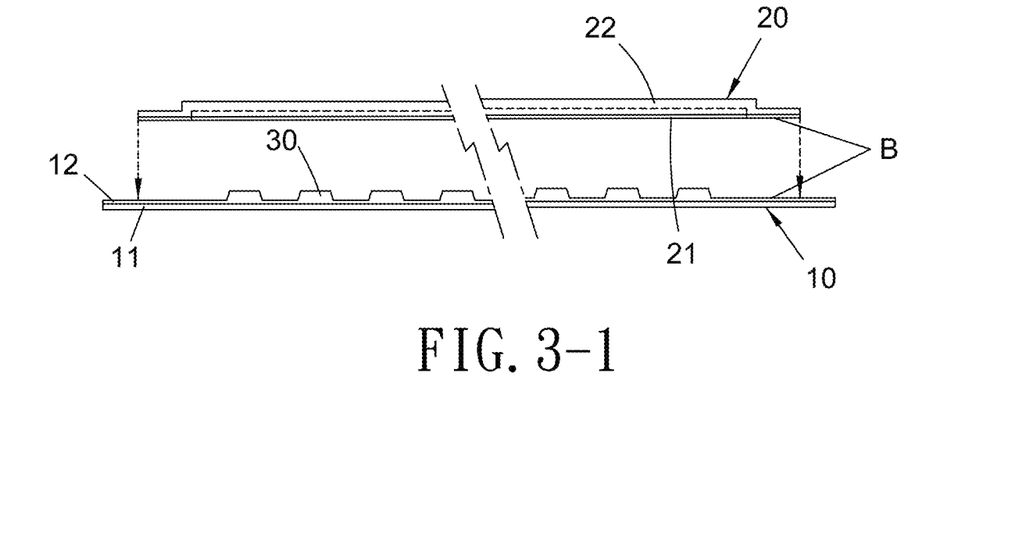
Figure 32:
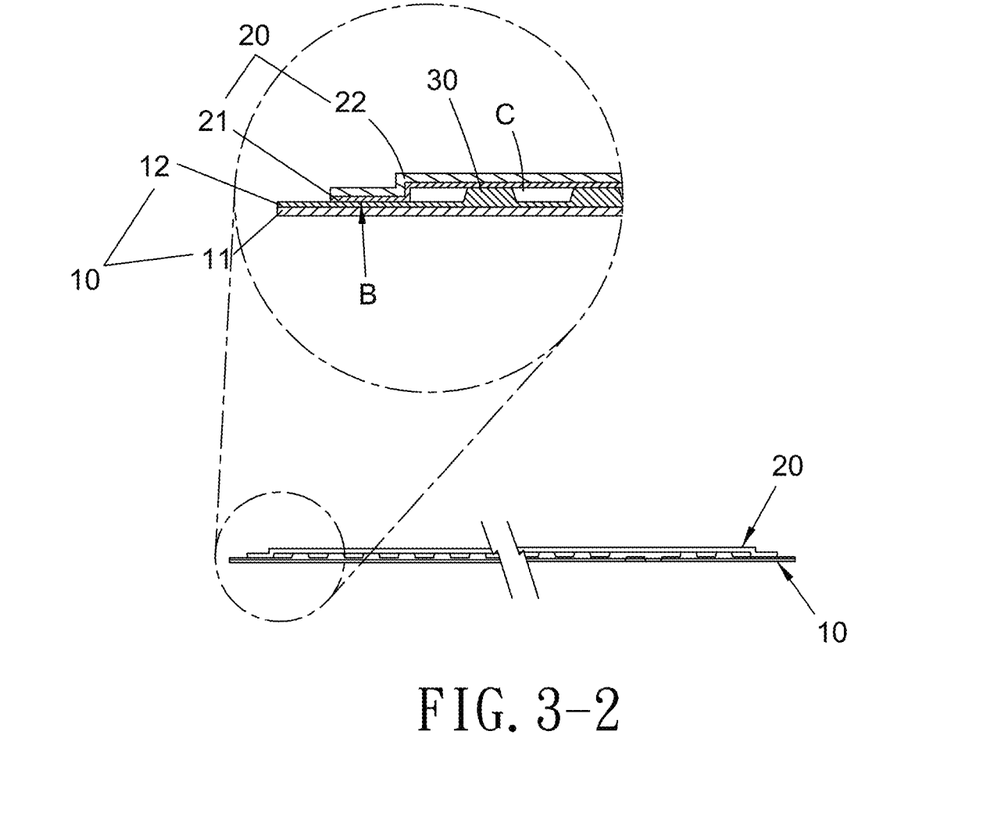

Refer to FIG. 3-1 and FIG. 3-2, a schematic drawing showing a lower shell 10, an upper shell 20 and a support member of an embodiment according to the present invention is disclosed. The lower shell 10 is a flat plate while the upper shell 20 includes a second recess portion which is recessed from the third surface 21 toward the fourth surface 22 and used to form the cavity C after the lower and upper shells 10, 20 being connected closely. The periphery B of the second surface 12 and the periphery B of the third surface 21 are wrapped around the second recess portion. The protrusions 30 are formed on the second surface 12 of the lower shell 10 by stamping and the distal end of the protrusion 30 is abutting against the third surface 21 of the upper shell 20.

Figure 4:
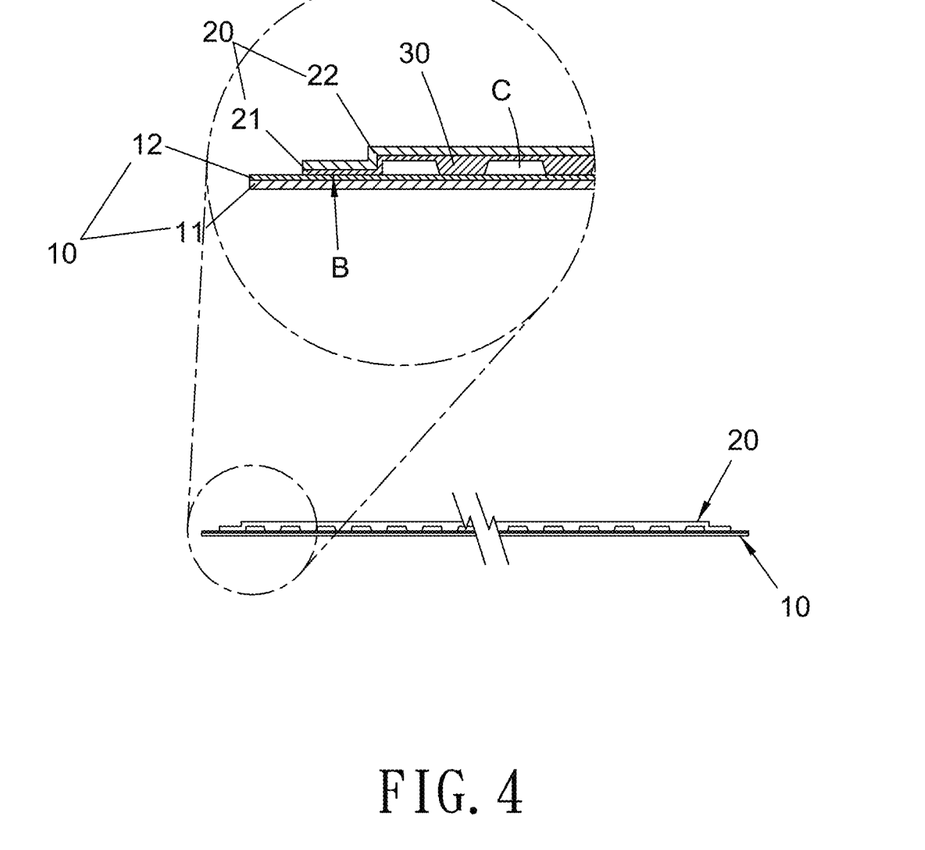
FIG. 4 shows a section and a partial enlarged view thereof of another embodiment with a lower shell, an upper shell and a support member according to the present invention.

Refer to FIG. 4, a further embodiment is disclosed. In this embodiment, the lower shell 10 is a flat plate while the upper shell 20 includes a second recess portion which is recessed from the third surface 21 toward the fourth surface 22 and used to form the cavity C. The periphery B of the second surface 12 and the periphery B of the third surface 21 are wrapped around the second recess portion. The difference between this embodiment and the one shown in FIG. 3-2 is in that the protrusions 30 are formed on the third surface 21 of the upper shell 20 by stamping process and the distal end of the protrusion 30 is abutting against the second surface 12 of the lower shell 10.

Figure 51:
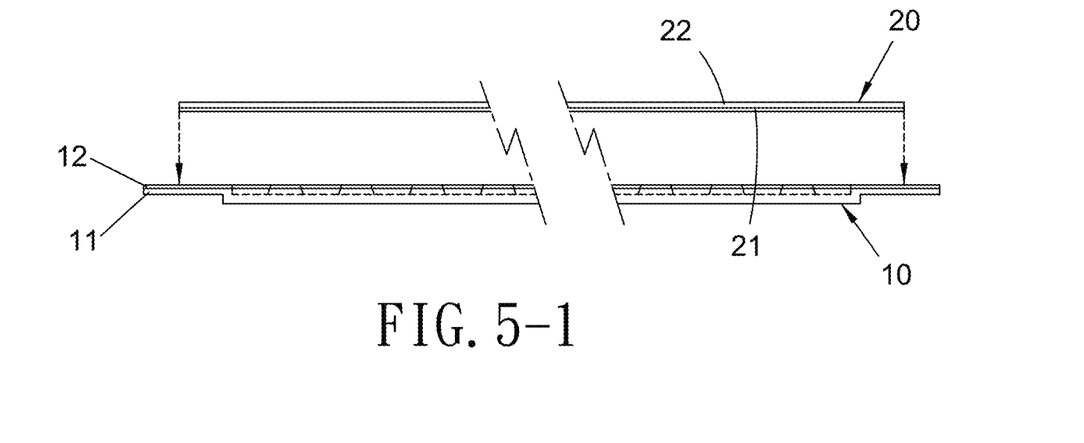
Figure 52:
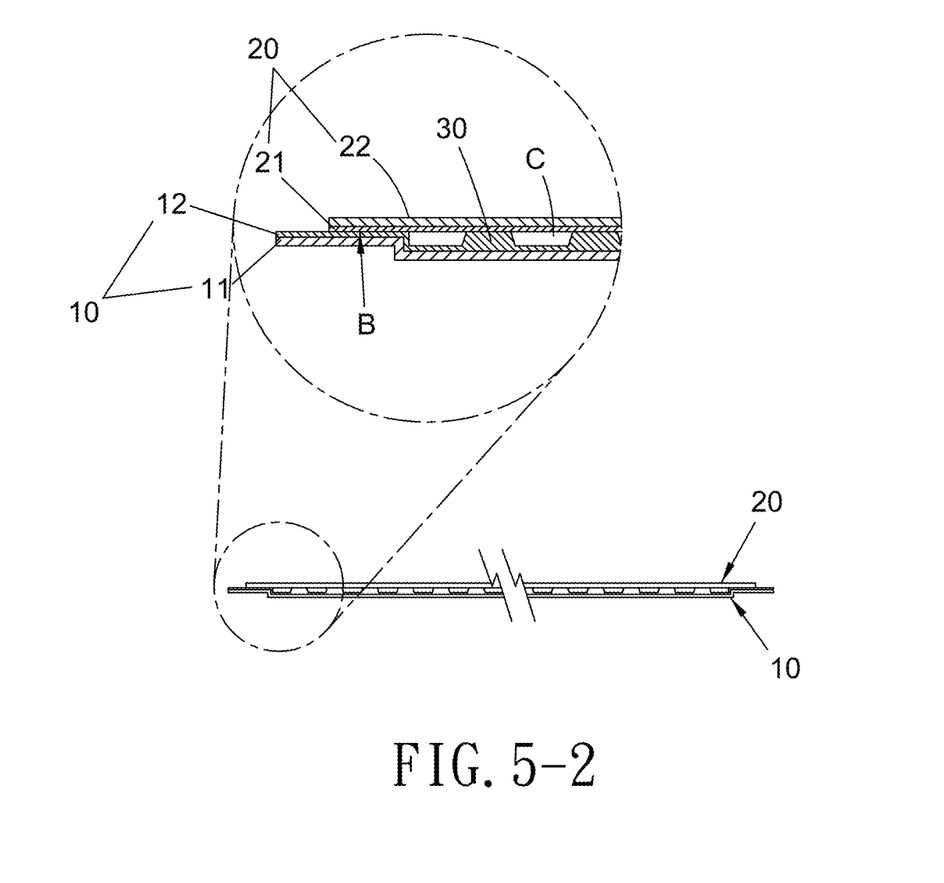

As to the third embodiment shown in FIG. 5-1 and FIG. 5-2, the upper shell 20 is a flat plate while the lower shell 10 includes a first recess portion which is recessed from the second surface 12 toward the first surface 11 and used to form the cavity C. The periphery B of the second surface 12 and the periphery B of the third surface 21 are wrapped around the first recess portion. The distal end of the protrusion 30 is abutting against the third surface 21 of the upper shell 20.

Figure 61:
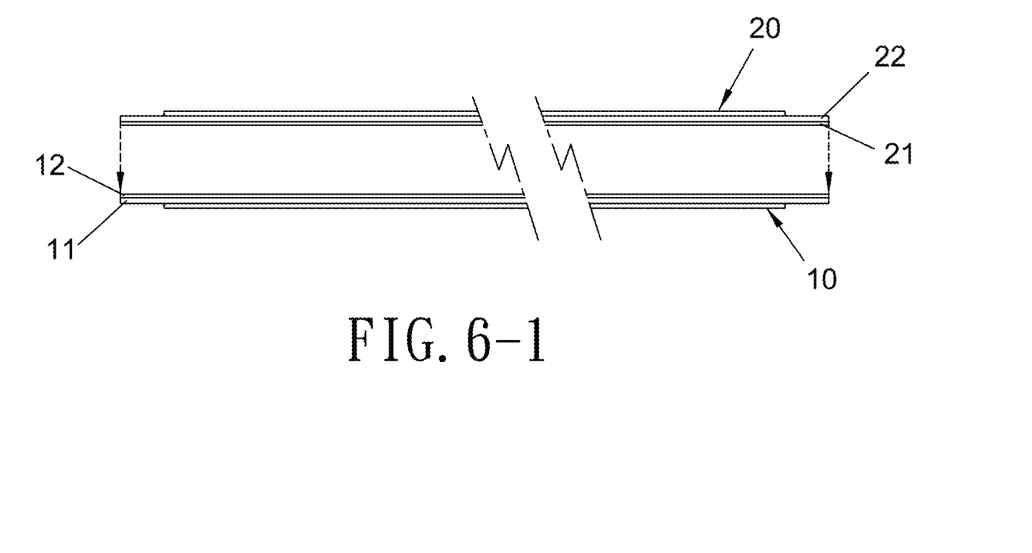
Figure 62:
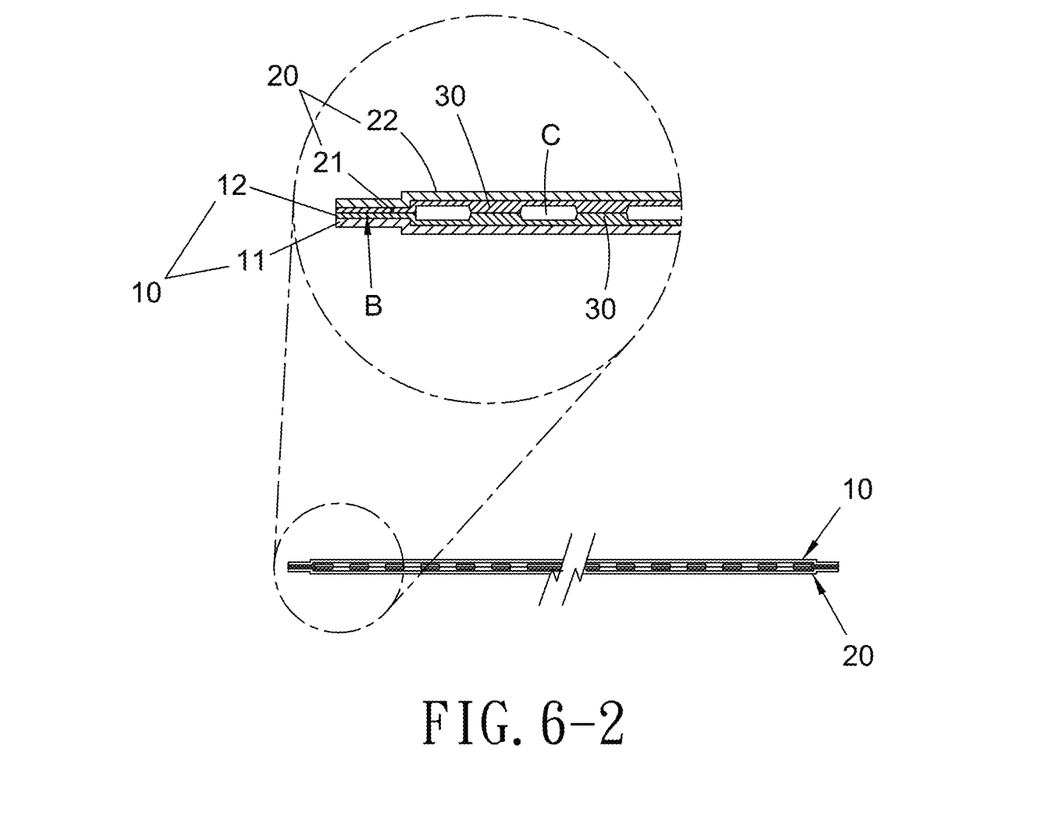

Refer to FIG. 6-1 and FIG. 6-2, a fourth embodiment is revealed. In this embodiment, the lower shell 10 includes a first recess portion recessed from the second surface 12 toward the first surface 11 and the periphery B of the second surface 12 is wrapped around the first recess portion. Similarly, the upper shell 20 includes a second recess portion recessed from the third surface 21 toward the fourth surface 22 and the periphery B of the third surface 21 is wrapped around the second recess portion. The first recess portion and the second recess portion together form the cavity C. The distal end of the protrusion 30 formed on the second surface 12 of the lower shell 10 and the distal end of the protrusion 30 formed on the third surface 21 of the upper shell 20 are abutting against each other.

Refer to FIG. 7, a further embodiment with a plurality protrusions 30 which are formed by stamping and having different structure is revealed. The difference between this embodiment and the one shown in FIG. 3-2 is in that the respective protrusions 30 formed on the second surface 12 have a larger height than those of the embodiment in FIG. 3-2. The distal end of the protrusion 30 is abutting against the third surface 21 and provided with a cap 31 which is produced by extrusion or stamping of the distal end of the protrusion 30. The cap 31 is used to guide liquid-phase working fluid 60 condensed on the third surface 21 flowing back to the bottom side of the protrusion 30. Thereby the working fluid 60 is attached to the surface on the inner side of the cavity C as much as possible. Therefore heat transfer and heat dissipation effects are achieved after the working fluid 60 absorbing the heat and transforming into vapor phase.

Figure 8:
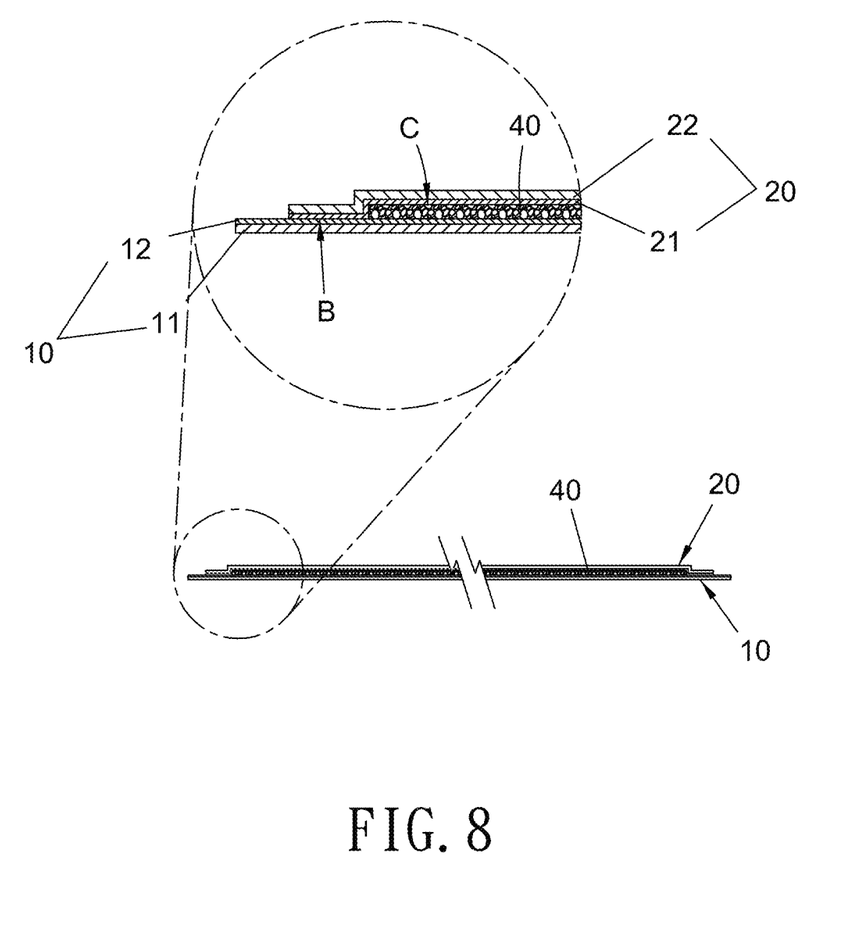
FIG. 8 shows a section and a partial enlarged view thereof of a further embodiment according to the present invention.

Refer to FIG. 8, a further embodiment is disclosed. The metal matrix of the metal composite plate forms both the first surface 11 of the lower shell 10 and the fourth surface 22 of the upper shell 20 while the second surface 12 of the lower shell 10 and the third surface 21 of the upper shell 20 are made of the copper layer. The difference between this embodiment and the one shown in FIG. 3-2 is in that the second surface 12 and the third surface 21 are flat surfaces and the support member is a copper mesh 40 which is attached to the surface on the inner side of the cavity C. For example, the copper mesh 40 is bonded to the surface on the inner side of the cavity C by sintering process. One of the functions of the copper mesh 40 is to prevent the lower shell 10 and upper shell 20 with the cavity C therebetween from damaged or collapsed. Another function of the copper mesh 40 is to be used as the wick structure of the vapor chamber.

The first surface 11 of the lower shell 10 and the fourth surface 22 of the upper shell 20 can also be the copper layers while the second surface 12 of the lower shell 10 and the third surface 21 of the upper shell 20 are made of the metal matrix of the metal composite plate in the embodiment shown in FIG. 8.

Figure 9:
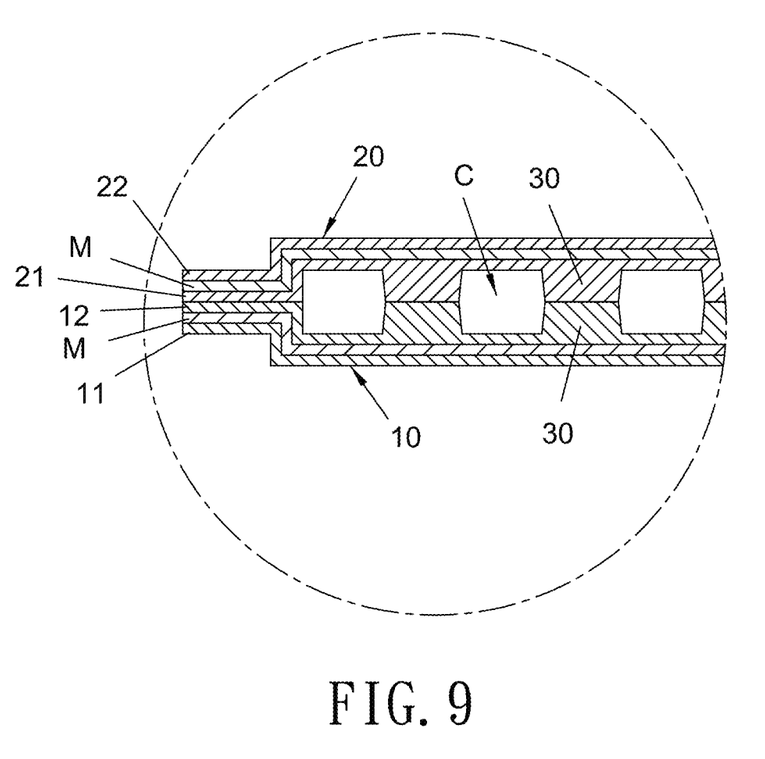
FIG. 9 is a partial enlarged view of a section of a further embodiment in which an upper shell and a lower shell are made of a three-layer metal composite plate according to the present invention.
Figure 10:
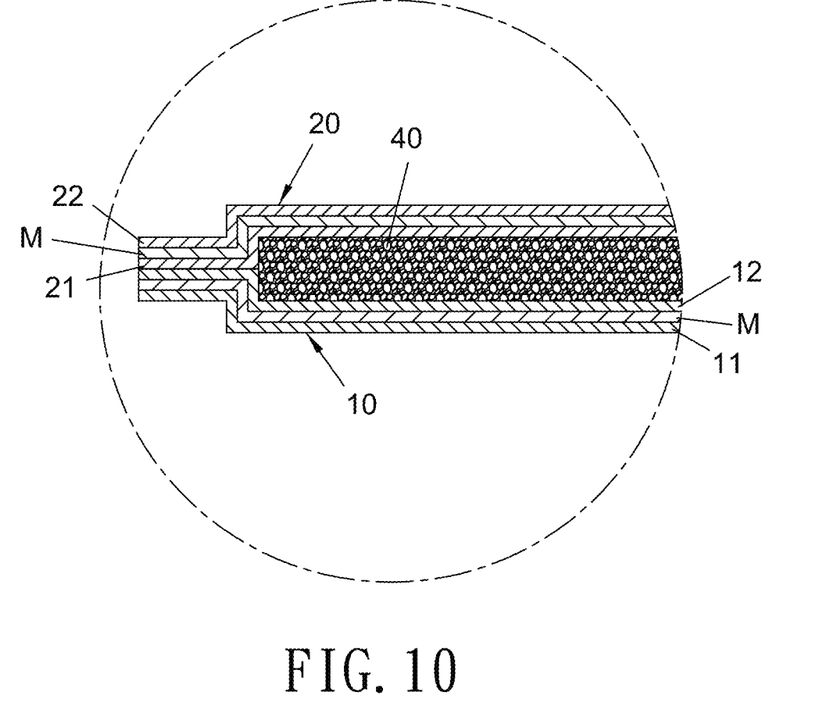
FIG. 10 is a partial enlarged view of a section of a further embodiment in which an upper shell and a lower shell are made of a three-layer metal composite plate according to the present invention.

Refer to FIG. 9, a further embodiment is revealed. The difference of this embodiment and the one shown in FIG. 3-2 is in that the lower shell 10 and the upper shell 20 in this embodiment are both made of the metal composite plate having three-layer structure. The three-layer metal composite plate consists of a metal matrix and two copper metal layers. A first copper layer and a second copper layer are arranged at surfaces on two opposite sides of the metal matrix respectively. The metal matrix can be stainless steel or one aluminum silicon carbide (Al/SiC) metal matrix composite (MMC), being disposed between the first copper layer and the second copper layer. The lower shell 10 includes a first surface 11 and a second surface 12 located on two opposite sides thereof respectively. The first copper layer is used to form the first surface 11 while the second copper layer forms the second surface 12. The upper shell 20 has a third surface 21 and a fourth surface 22 located on two opposite sides thereof respectively. The first copper layer forms the third surface 21 while the second copper layer is used to form the fourth surface 22. The harder metal matrix is used as the intermediate layer M between the lower shell 10 and the upper shell 20. In this embodiment, the lower shell 10 and the upper shell 20 made of three-layer metal composite plate as well as the shape and the structure of the support member can be modified with reference to the above embodiments shown in FIG. 3-1 to FIG. 8. For example, the support member in FIG. 9 includes a plurality of protrusions 30 formed by stamping process while the support member in FIG. 10 is a copper mesh 40.

As a preferred embodiment, the metal matrix of the three-layer metal composite plate includes stainless steel and an aluminum silicon carbide (Al/SiC) metal matrix composite. The thickness of the three-layer metal composite plate is 0.05 mm to 3.0 mm. The first copper layer and the second copper layer of the three-layer metal composite plate have the same thickness while the total thickness of the first and the second cooper layers is 5%~50% of the thickness of the three-layer metal composite plate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A vapor chamber comprising:
    a lower shell made of a metal composite plate and including:
        a first surface and a second surface located on two opposite sides of the lower shell respectively, and
        a lower half tube extending from the edge of the lower shell and provided with a first slot recessed from the second surface toward the first surface;
        the metal composite plate having a metal matrix and a copper layer composited together while the coppers layer is bonded to a surface on one side of the metal matrix; the first surface having at least one flat surface for being in contact with a heat source;
    an upper shell made of the metal composite plate and including:
        a third surface and a fourth surface on two opposite sides of the upper shell respectively, and
        an upper half tube which is extending from the edge of the upper shell, corresponding to the lower half tube, and having a second slot recessed from the third surface toward the fourth surface;
        a periphery of the second surface of the lower shell and a periphery of the third surface of the upper shell being connected closely to form a hollow cavity between the lower shell and the upper shell while edges at two sides of the lower half tube and the upper half tube are connected tightly and working together to form a metal tube communicating with the cavity; wherein redundant part of the metal tube is cut and hole of the metal tube is sealed to form the vacuum sealed cavity after evacuation of the cavity;
    a support member which is mounted in the cavity and located between the second surface and the third surface for supporting the vacuum sealed cavity; and
    a working fluid filled into the vacuum sealed cavity;
    wherein a thickness of the vapor chamber is ranging from 1.0 mm to 6.0 mm; the metal matrix of the metal composite plate includes stainless steel and an aluminum silicon carbide (Al/SiC) metal matrix composite; a thickness of the metal composite plate is in the range of 0.05 mm to 3.0 mm; the thickness of the copper layer is 5%-50% of the thickness of the metal composite plate;
    wherein the metal matrix forms both the first surface of the lower shell and the fourth surface of the upper shell while the second surface of the lower shell and the third surface of the upper shell are formed by the copper layer; the support member includes a plurality of protrusions produced by stamping process and formed on the second surface, the third surface or both the second surface and the third surface; the protrusion is a truncated cone and an interval is formed between bottoms of the two adjacent protrusions while a ratio of the maximum width of the truncated conical protrusion to the interval is 1:1 to 1:0.5.

2. The vapor chamber as claimed in claim 1, wherein a distal end of each of the protrusions formed on the second surface is abutting against the third surface and a cap is arranged at the distal end of each of the protrusions.

3. The vapor chamber as claimed in claim 1, wherein a distal end of each of the protrusions formed on the third surface is abutting against the second surface and a cap is disposed on the distal end of each of the protrusions.

4. The vapor chamber as claimed in claim 1, wherein a distal end of each of the protrusions formed on the second surface and a distal end of each of the protrusions formed on the third surface are abutting against each other.

5. The vapor chamber as claimed in claim 1, wherein the copper layer forms both the first surface of the lower shell and the fourth surface of the upper shell while the second surface of the lower shell and the third surface of the upper shell are formed by the metal matrix; the support member is a copper mesh which is attached to a surface on an inner side of the cavity.

6. The vapor chamber as claimed in claim 1, wherein the lower shell is a flat plate while the upper shell includes a second recess portion which is recessed from the third surface toward the fourth surface; the second recess portion and the lower shell together form the cavity; the periphery of the second surface and the periphery of the third surface are wrapped around the second recess portion.

7. The vapor chamber as claimed in claim 1, wherein the upper shell is a flat plate while the lower shell includes a first recess portion which is recessed from the second surface toward the first surface; the first recess portion and the upper shell together form the cavity; the periphery of the second surface and the periphery of the third surface are wrapped around the first recess portion.

8. The vapor chamber as claimed in claim 1, wherein the lower shell includes a first recess portion recessed from the second surface toward the first surface and the periphery of the second surface is wrapped around the first recess portion; the upper shell includes a second recess portion recessed from the third surface toward the fourth surface and the periphery of the third surface is wrapped around the second recess portion; the first recess portion and the second recess portion together form the cavity.

* * * * *